US012610858B2

(12) United States Patent
Cho et al.

(10) Patent No.: US 12,610,858 B2
(45) Date of Patent: Apr. 21, 2026

(54) LIGHT EMITTING MODULE AND DISPLAY APPARATUS HAVING THE SAME

(71) Applicant: SEOUL VIOSYS CO., LTD., Ansan-si (KR)

(72) Inventors: Dae Sung Cho, Ansan-si (KR); So Ra Lee, Ansan-si (KR); Chung Hoon Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 566 days.

(21) Appl. No.: 17/743,602

(22) Filed: May 13, 2022

(65) Prior Publication Data

US 2022/0406764 A1 Dec. 22, 2022

Related U.S. Application Data

(60) Provisional application No. 63/333,551, filed on Apr. 21, 2022, provisional application No. 63/188,722, filed on May 14, 2021.

(51) Int. Cl.
*H01L 25/16* (2023.01)
*H10H 20/851* (2025.01)
(Continued)

(52) U.S. Cl.
CPC ........ *H01L 25/167* (2013.01); *H10H 20/8515* (2025.01); *H10H 20/853* (2025.01); *H10H 20/855* (2025.01)

(58) Field of Classification Search
CPC ..... H01L 25/167; H01L 33/507; H01L 33/54; H01L 33/58; H01L 33/46; H01L 33/504;
(Continued)

(56) References Cited

U.S. PATENT DOCUMENTS 8,507,923 B2 8/2013 Kim et al.
8,759,125 B2 * 6/2014 Tischler .............. H01L 31/0203
257/89
(Continued)

FOREIGN PATENT DOCUMENTS

CN 108008564 A * 5/2018 ........... C09K 11/883
CN 109004078 A * 12/2018 ........... H01L 27/156
(Continued)

OTHER PUBLICATIONS

International Search Report dated Nov. 17, 2022, issued to WO Patent Application No. PCT/KR2022/006950 (with English Translation).
(Continued)

*Primary Examiner* — Mohammed Shamsuzzaman
(74) *Attorney, Agent, or Firm* — Oblon, McClelland, Maier & Neustadt, L.L.P.

(57) ABSTRACT

A light emitting module including a substrate, a plurality of light emitting devices disposed on the substrate and configured to emit light of a first wavelength, a partition structure formed between the light emitting devices, and a wavelength converter configured to convert light of the first wavelength emitted from the light emitting devices into light of another wavelength, the wavelength converter including a first layer including a light absorption layer and a first wavelength conversion portion and a second layer including a light absorption layer and a second wavelength conversion portion, in which the first wavelength conversion portion in the first layer is laterally spaced apart from the second wavelength conversion portion in the second layer in plan view.

14 Claims, 6 Drawing Sheets

(51) Int. Cl.
   *H10H 20/853*        (2025.01)
   *H10H 20/855*        (2025.01)

(58) Field of Classification Search
   CPC . H01L 25/0753; H01L 33/483; H01L 33/502;
   C09K 11/08
   See application file for complete search history.

(56)                References Cited

U.S. PATENT DOCUMENTS

| | | | | |
|---|---|---|---|---|
| 10,304,811 | B2 * | 5/2019 | Zhang | H01L 25/0753 |
| 10,423,032 | B2 * | 9/2019 | Lee | G02F 1/133617 |
| 10,580,348 | B2 * | 3/2020 | Bae | G09G 3/32 |
| 11,121,172 | B2 | 9/2021 | Lee et al. | |
| 11,189,759 | B2 * | 11/2021 | Onuma | H01L 33/58 |
| 11,378,843 | B2 * | 7/2022 | Chen | G02F 1/133514 |
| 11,476,216 | B2 * | 10/2022 | Chaji | H01L 24/95 |
| 11,588,078 | B2 * | 2/2023 | Kuo | H01L 27/156 |
| 12,048,220 | B2 * | 7/2024 | Lee | H01L 25/167 |
| 12,075,565 | B2 * | 8/2024 | Chaji | H05K 13/0069 |
| 12,136,610 | B2 * | 11/2024 | Cha | H01L 33/58 |
| 2007/0159067 | A1 * | 7/2007 | Yun | C09K 11/584 313/503 |
| 2009/0057690 | A1 * | 3/2009 | Chakraborty | H01L 33/504 257/E33.001 |
| 2012/0014091 | A1 * | 1/2012 | He | H01L 25/0753 257/89 |
| 2014/0198373 | A1 * | 7/2014 | Ray | H01L 33/60 257/89 |
| 2014/0367633 | A1 * | 12/2014 | Bibl | H01L 33/56 257/13 |
| 2014/0367711 | A1 * | 12/2014 | Bibl | H01L 24/24 257/89 |
| 2015/0042933 | A1 * | 2/2015 | Ueki | G02B 5/0242 359/599 |
| 2015/0131280 | A1 | 5/2015 | Harbers et al. | |
| 2017/0179438 | A1 * | 6/2017 | Xu | H10K 59/8791 |
| 2018/0261736 | A1 * | 9/2018 | Bonar | H01L 33/0093 |
| 2018/0269354 | A1 * | 9/2018 | Oh | H01L 27/15 |
| 2019/0302519 | A1 * | 10/2019 | Park | G02B 5/201 |
| 2019/0312084 | A1 * | 10/2019 | Kang | H01L 33/505 |
| 2019/0324350 | A1 * | 10/2019 | Van Der Sijde | H05B 45/30 |
| 2019/0348470 | A1 * | 11/2019 | Song | H10K 59/879 |
| 2020/0176516 | A1 * | 6/2020 | Yan | H10K 50/854 |
| 2020/0217998 | A1 * | 7/2020 | Jung | G02F 1/133514 |
| 2020/0279979 | A1 | 9/2020 | Lee et al. | |
| 2021/0005791 | A1 * | 1/2021 | Shi | H01L 33/58 |
| 2021/0181550 | A1 * | 6/2021 | Su | G02B 6/0026 |
| 2021/0210558 | A1 * | 7/2021 | Huo | H10K 59/38 |
| 2022/0005984 | A1 * | 1/2022 | Liao | H01L 33/502 |
| 2022/0181526 | A1 * | 6/2022 | Bohmer | H01L 33/504 |
| 2023/0050227 | A1 * | 2/2023 | Ahn | H10K 59/38 |
| 2024/0105757 | A1 * | 3/2024 | Jang | H01L 27/15 |

FOREIGN PATENT DOCUMENTS

| | | | | | |
|---|---|---|---|---|---|
| CN | 109390374 | A | * | 2/2019 | G02B 5/201 |
| CN | 111477618 | A | * | 7/2020 | G02B 27/0172 |
| CN | 211858650 | U | * | 11/2020 | G02F 1/01791 |
| CN | 112805600 | A | * | 5/2021 | G02B 1/04 |
| CN | 113257855 | A | * | 8/2021 | G02F 1/01791 |
| CN | 114141934 | A | * | 3/2022 | G09F 9/33 |
| EP | 3442023 | A1 | * | 2/2019 | G02B 5/201 |
| JP | 2008186850 | A | * | 8/2008 | G02B 27/0172 |
| KR | 10-2013-0036447 | | | 4/2013 | |
| KR | 10-2013-0070722 | | | 6/2013 | |
| KR | 10-2014-0072006 | | | 6/2014 | |
| KR | 10-2020-0070228 | | | 6/2020 | |
| TW | 201409762 | A | * | 3/2014 | H01L 33/502 |
| WO | WO-2019079381 | A1 | * | 4/2019 | G02B 27/0172 |
| WO | WO-2020220792 | A1 | * | 11/2020 | G02B 27/0172 |

OTHER PUBLICATIONS

Extended European Search Report issued Apr. 15, 2025 in European Patent Application No. 22807912.5, 7 pages.
Office Action issued Feb. 9, 2026, in corresponding Korean Patent Application No. 10-2023-7030408 (with English translation), 10 pages.

* cited by examiner

LIGHT EMITTING MODULE AND DISPLAY APPARATUS HAVING THE SAME

CROSS REFERENCE TO RELATED APPLICATIONS

This application claims the benefit of U.S. Provisional Patent Application No. 63/188,722, filed on May 14, 2021, and U.S. Provisional Patent Application No. 63/333,551, filed on Apr. 21, 2022, which are hereby incorporated by reference for all purposes as if fully set forth herein.

BACKGROUND

Field

Exemplary embodiments of the invention relate generally to a light emitting module for a display and a display apparatus, and more specifically, to a light emitting module having a wavelength converter and a display apparatus having the same.

Discussion of the Background

Light emitting devices are typically semiconductor devices using light emitting diodes as inorganic light sources, and are used in various technical fields, such as display apparatuses, automobile lamps, general lighting, and the like. Light emitting diodes have advantages, such as longer lifespan, lower power consumption, and quicker response, than conventional light sources, and thus, the light emitting diodes have been replacing the conventional light sources.

The conventional light emitting diodes have been generally used as backlight light sources in display apparatuses, but display apparatuses that directly realize images using the light emitting diodes have been recently developed. Such displays are also referred to as micro LED displays.

In general, the display apparatus realizes various colors using a mixed color of blue, green, and red. The display apparatus includes a plurality of pixels each including sub-pixels corresponding to one of blue, green, and red light in order to realize various images. As such, a color of a certain pixel is typically determined based on the colors of the sub-pixels, so that images can be realized through the combination of such pixels.

Meanwhile, blue, green, and red light may be realized by using a wavelength converter in conjunction with ultraviolet or blue light emitting diodes. For example, by arranging the same type of blue light emitting diodes, and then arranging green and red phosphors corresponding to the light emitting diodes, blue light emitted from the blue light emitting diodes may be wavelength-converted into green light or red light. Accordingly, blue light emitted without wavelength conversion and green light and red light emitted after wavelength conversion may be used to realize a display image. As another example, when ultraviolet light emitting diodes are used, blue phosphors may be additionally formed, and thus, blue light, green light, and red light emitted after wavelength conversion may be used to realize a display image.

However, in a case of the micro LED display, since sizes of the light emitting diodes are very small and an interval between the light emitting diodes is extremely narrow, it is difficult to form fine wavelength conversion regions corresponding to each light emitting diode. In addition, it is also difficult to arrange the wavelength conversion regions at required locations corresponding to respective light emitting diodes.

The above information disclosed in this Background section is only for understanding of the background of the inventive concepts, and, therefore, it may contain information that does not constitute prior art.

SUMMARY

Light emitting modules constructed according to exemplary embodiments of the invention are capable of easily forming and arranging wavelength conversion regions corresponding to respective light emitting diodes, and a display apparatus having the same.

Additional features of the inventive concepts will be set forth in the description which follows, and in part will be apparent from the description, or may be learned by practice of the inventive concepts.

A light emitting module according to an exemplary embodiment includes a substrate, a plurality of light emitting devices disposed on the substrate and configured to emit light of a first wavelength, a partition structure formed between the light emitting devices, and a wavelength converter configured to convert light of the first wavelength emitted from the light emitting devices into light of another wavelength. The wavelength converter includes a first layer including a light absorption layer and a first wavelength conversion portion, and a second layer including a light absorption layer and a second wavelength conversion portion, in which the first wavelength conversion portion in the first layer is laterally spaced apart from the second wavelength conversion portion in the second layer in plan view.

The first wavelength conversion portion and the second wavelength conversion portion may include phosphors or quantum dots. For example, the first and second wavelength conversion portions may include a carrier material such as silicone or epoxy, and phosphors or quantum dots dispersed in the carrier material.

The wavelength converter may further include a third layer including a light absorption layer and a third wavelength conversion portion. The third wavelength conversion portion may include phosphors or quantum dots.

The first layer may include a red wavelength conversion portion, the second layer may include a green wavelength conversion portion, and the third layer may include a blue wavelength conversion portion.

The second wavelength conversion portion in the second layer may be laterally spaced apart from the third wavelength conversion portion in the third layer in plan view.

Furthermore, the first wavelength conversion portion in the first layer may be laterally spaced apart from the third wavelength conversion portion in the third layer in plan view.

The wavelength converter may further include a molding layer including a light absorbing material on an upper surface thereof.

The partition structure may include grooves corresponding to each of the light emitting devices.

The light emitting module may further include a molding member formed in the grooves. The molding member may include a light diffuser.

The sidewalls of the grooves may be perpendicular to an upper surface of the substrate. A width of the groove may increase as being disposed further away from the substrate.

The first layer may further include a transparent molding portion laterally spaced apart from the first wavelength conversion portion, and the second layer may further include a transparent molding portion laterally spaced apart from the second wavelength conversion portion. The transparent molding portion in the second layer may be overlapped with the first wavelength conversion portion in the first layer, and the transparent molding portion in the first layer may be overlapped with the second wavelength conversion portion in the second layer.

The wavelength converter may further include a third layer including a light absorption layer, a transparent molding portion, and a third wavelength conversion portion, in which the transparent molding portion in the third layer may be laterally spaced apart from the third wavelength conversion portion, and the transparent molding portion in the third layer may be overlapped with the first wavelength conversion portion in the first layer or the second wavelength conversion portion in the second layer.

The transparent molding portion in each of the first through third layers may be formed in plural, and the transparent molding portion in any one of the first through third layers may be overlapped with the transparent molding portion in another one of the first through third layers.

The transparent molding portion may include a light diffuser.

The light emitting module may further include a transparent adhesive layer disposed between the first layer and the second layer.

The light emitting module may further include an ultraviolet filter disposed on the wavelength converter. The ultraviolet filter may include an absorption filter including an ultraviolet absorber or an interference filter.

A display apparatus according to another exemplary embodiment may includes a panel substrate; and a light emitting module disposed on the panel substrate. The light emitting module may be any one of the light emitting modules described above.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
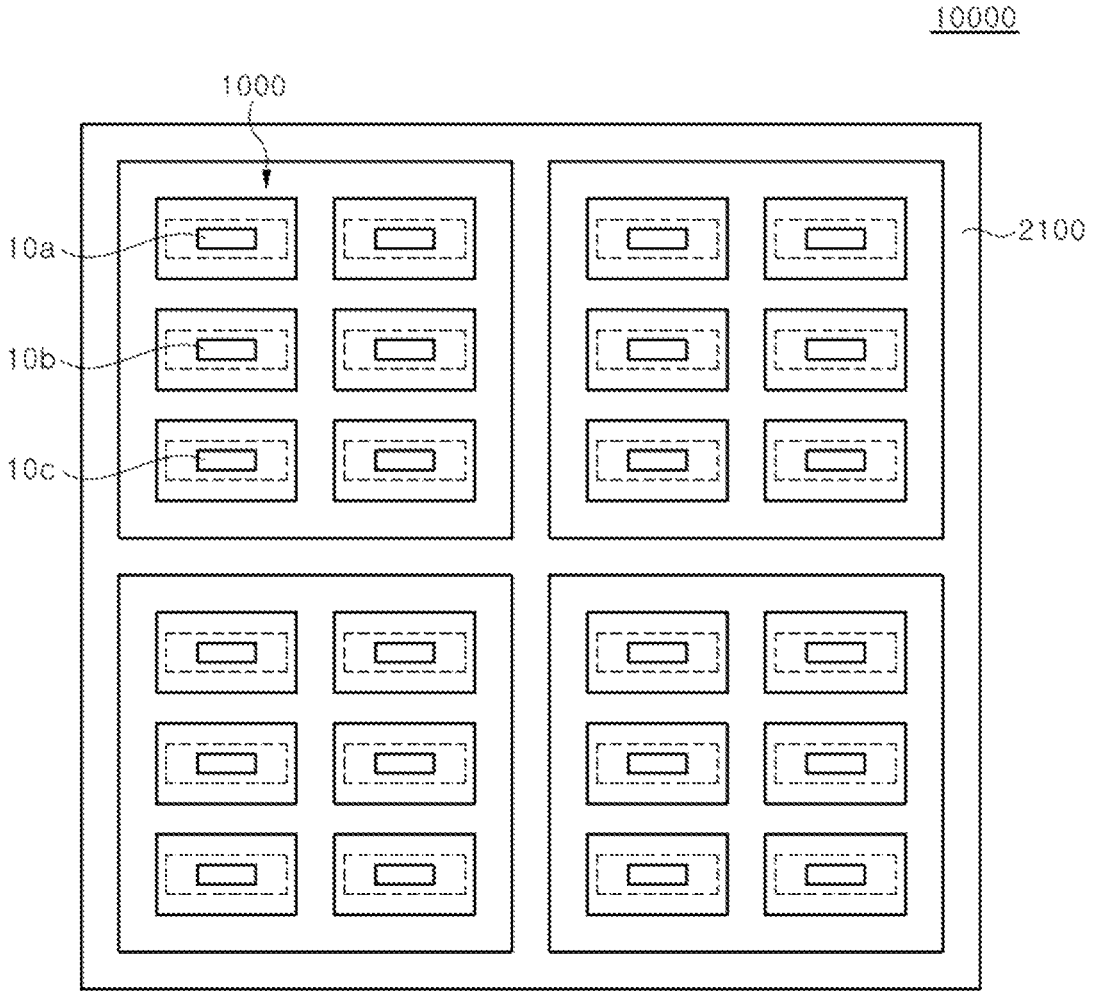
FIG. 1 is a schematic plan view illustrating a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic plan view illustrating a display apparatus according to an exemplary embodiment.

Referring to FIG. 1, a display apparatus 10000 may include a panel substrate 2100 and a plurality of light emitting modules 1000.

The display apparatus 10000 is not particularly limited, but it may include a virtual reality (VR) display apparatus, such as a micro LED TV, a smart watch, a VR headset, or an argument reality (AR) display apparatus, such as augmented reality glasses.

The panel substrate 2100 may include a circuit for a passive matrix driving or active matrix driving. In an exemplary embodiment, the panel substrate 2100 may include interconnections and resistors therein, and in another exemplary embodiment, the panel substrate 2100 may include interconnections, transistors, and capacitors. The panel substrate 2100 may also have pads on an upper surface thereof that may be electrically connected to the circuits disposed thereon.

In an exemplary embodiment, the plurality of light emitting modules 1000 is arranged on the panel substrate 2100. Each of the light emitting modules 1000, as shown in FIG. 2A, may include a circuit board 1001 and a plurality of light emitting devices 10a, 10b, and 10c disposed on the circuit board 1001.

Figure 2A:
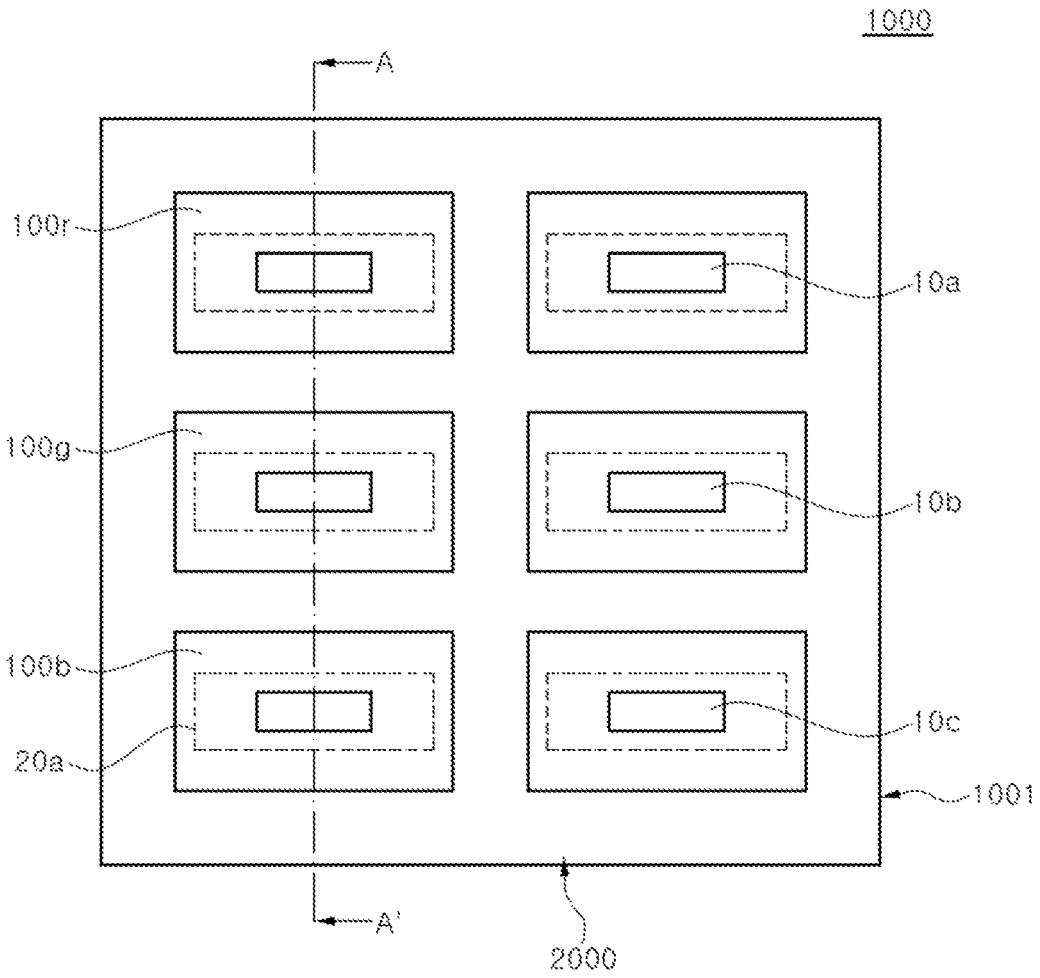
FIG. 2A is a schematic plan view illustrating a light emitting module according to an exemplary embodiment.
Figure 2B:
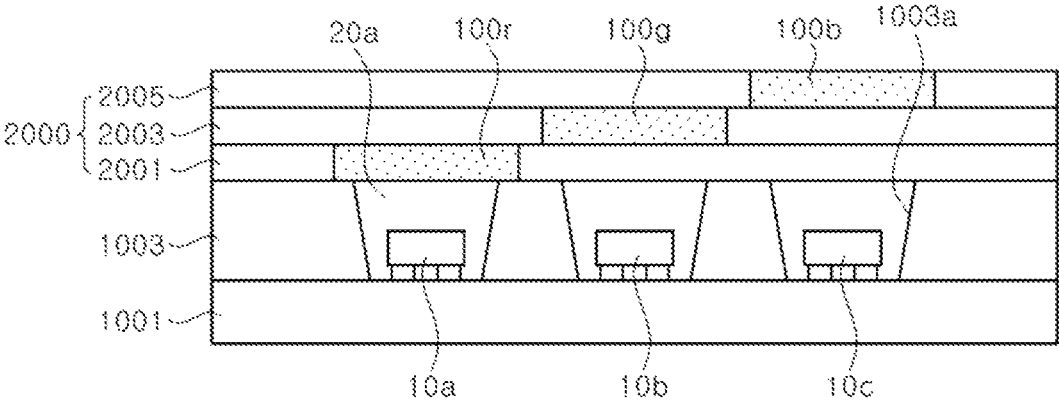
FIG. 2B is a schematic cross-sectional view taken along line A-A' of its corresponding plan view shown in FIG. 2A.

FIG. 2A is a schematic plan view illustrating a light emitting module 1000 according to an exemplary embodiment, and FIG. 2B is a schematic cross-sectional view taken along line A-A' of its corresponding plan view shown in FIG. 2A.

Referring to FIG. 2A and FIG. 2B, the light emitting module 1000 may include a circuit board 1001, a partition structure 1003, light emitting devices 10a, 10b, and 10c, and a wavelength converter 2000.

The circuit board 1001 may include a circuit electrically connected to the light emitting devices 10a, 10b, and 10c. The circuit board 1001 may include multi-layered interconnections, and pads may be exposed on an upper surface thereof. The circuit board 1001 may also have pads on a bottom surface thereof so as to be electrically connected to the panel substrate 2100. However, the inventive concepts are not limited thereto, and in some exemplary embodiments, driving circuits for driving the light emitting devices 10a, 10b, and 10c may be disposed in the circuit board 1001, or the panel substrate 2100 may just be a support substrate or frame for supporting the light emitting modules 1000.

The light emitting devices 10a, 10b, and 10c may be electrically connected to the pads on the circuit board 1001. The light emitting devices 10a, 10b, and 10c are spaced apart from one another on the circuit board 1001. The light emitting devices 10a, 10b, and 10c may be arranged regularly, for example, in a matrix form, without being limited thereto.

The light emitting devices 10a, 10b, and 10c may emit the same type of light. For example, the light emitting devices 10a, 10b, and 10c may emit ultraviolet or blue light, for example, light within a wavelength range of 320 nm to 465 nm. In the illustrated exemplary embodiment, although different reference numbers are given to the light emitting devices 10a, 10b, and 10c, they may be light emitting devices having the same structure. In particular, the light emitting devices 10a, 10b, and 10c may include gallium nitride based light emitting diodes. The light emitting devices 10a, 10b, and 10c may be fabricated together on the same wafer, and may be transferred together onto the circuit board 1001. Accordingly, the process of transferring the light emitting devices 10a, 10b, and 10c may be simplified. However, the inventive concepts are not necessarily limited thereto. The light emitting devices 10a, 10b, and 10c will be described in detail later with reference to FIG. 3A and FIG. 3B.

Figure 6:
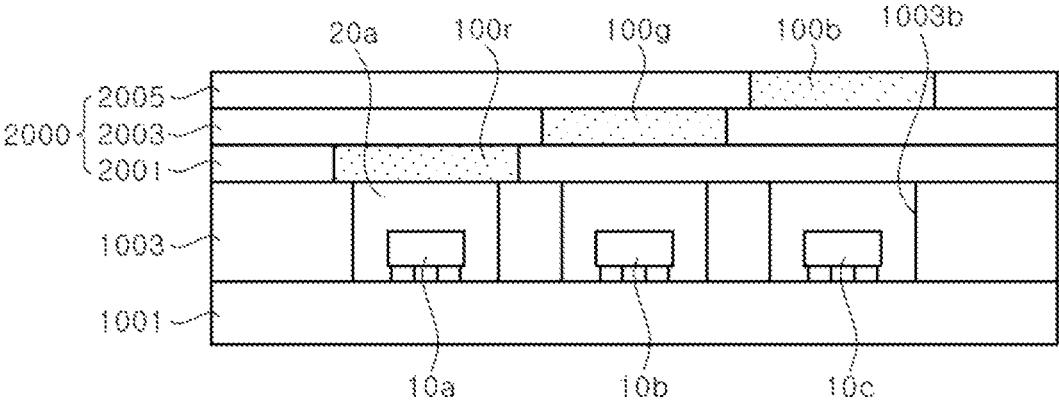
FIG. 6 is a schematic cross-sectional view illustrating a light emitting module according to an exemplary embodiment.

The partition structure 1003 is formed on the circuit board 1001, and disposed between the light emitting devices 10a, 10b, and 10c. The partition structure 1003 may have a mesh shape, and may be formed to have an empty space, e.g., a groove, in a region in which the light emitting devices 10a, 10b, and 10c are to be disposed. As shown in FIG. 2B, the partition structure 1003 may have inclined sidewalls around the light emitting devices 10a, 10b, and 10c. For example, the partition structure 1003 may be inclined so as to provide an empty space that increases in width as it is disposed in a direction upwardly apart from the light emitting devices 10a, 10b, and 10b. However, the inventive concepts are not limited thereto, and in some exemplary embodiments, the partition structure 1003 may provide vertical sidewalls as shown in FIG. 6, or may be inclined so as to provide an empty space that decreases in width as it is disposed in a direction upwardly apart from the light emitting devices 10a, 10b, and 10b. In some exemplary embodiments, the partition structure 1003 may also have a curved slope in some regions.

The partition structure 1003 may be formed of a molding member, such as silicone. The partition structure 1003 may be formed of a reflection material such as a white wall, or a light absorbing material such as a black matrix. By the partition structure 1003, light exiting regions of the light emitting devices 10a, 10b, and 10c may be limited, and light interference between the light emitting devices 10a, 10b, and 10c may be prevented. Accordingly, light emitted from the light emitting devices 10a, 10b, and 10c may be guided to the wavelength converter 2000, and may be emitted to the outside only through the wavelength converter 2000.

An empty space (groove) may be defined around the light emitting devices 10a, 10b, and 10c by the partition structure 1003, and the light emitting devices 10a, 10b, and 10c may be covered by a molding member 20a formed in the empty space. The molding member 20a may include a light diffusion material. The molding member 20a may fill the empty space formed by the partition structure 1003. The molding member 20a may include a wavelength conversion material. The molding member 20a may be formed of a material having high transmittance to light emitted from the light emitting devices 10a, 10b, and 10c. In some exemplary embodiments, the molding member 20a may be transparent.

The wavelength converter 2000 may be disposed on the partition structure 1003. The wavelength converter 2000 may include at least one wavelength conversion material, and may be formed on the partition structure 1003 using a molding technique, or may be disposed on the partition structure 1003 after being manufactured in a form of a sheet. The wavelength converter 2000 may include a plurality of wavelength conversion portions, and may include, for example, a first layer 2001, a second layer 2003, and a third layer 2005. Each layer may include a different wavelength conversion portion from each other. For example, when each of the light emitting devices 10a, 10b, and 10c includes a ultraviolet light emitting diode, the first layer 2001 may include a red wavelength conversion portion 100r, and the second layer 2003 may include a green wavelength conversion portion 100g, and the third layer 2005 may include a blue wavelength conversion portion 100b. The red wavelength conversion portion 100r may be disposed to correspond to the light emitting device 10a, the green wavelength conversion portion 100g may be disposed to correspond to the light emitting device 10b, and the blue wavelength conversion portion 100b may be disposed to correspond to the light emitting device 10c. The light emitting module 1000, as shown in FIG. 2A, may include a plurality of light emitting devices 10a, light emitting devices 10b, and light emitting devices 10c, and the red, green, and blue wavelength conversion portions 100r, 100g, and 100b may be disposed over respective corresponding light emitting devices 10a, 10b, and 10c. By disposing the wavelength conversion portions corresponding to each of the light emitting devices in the first layer 2001, the second layer 2003, and the third layer 2005, respectively, an interval between the wavelength conversion portions in a same layer may be increased. Accordingly, it is possible to improve purity of light emitted from each of the wavelength conversion portions by preventing color mixing of light emitted through the wavelength conversion portions corresponding to each of the light emitting devices.

The wavelength conversion portions 100r, 100g, and 100b may have larger areas than the corresponding light emitting devices 10a, 10b, and 10c, respectively. In addition, the wavelength conversion portions 100r, 100g, and 100b may have areas equal to or larger than the empty space formed by the partition structure 1003. As shown in FIG. 2B, the wavelength conversion portions 100r, 100g, and 100b may cover the molding members 20a of the corresponding light emitting devices 10a, 10b, and 10c, respectively. Accordingly, it is possible to prevent light emitted from the light emitting devices 10a, 10b, and 10c from being emitted to the outside without wavelength conversion, and also, as well as preventing light loss by the light absorbing material around the wavelength conversion portions 100r, 100g, and 100b.

Remaining portions excluding each of the wavelength conversion portions 100r, 100g, and 100b formed on each layer may be formed of a light adsorbing material, such as black molding. By preparing a black molding sheet having empty spaces for forming each of the wavelength conversion portions 100r, 100g, or 100b, and filling the empty spaces with a fluid material containing a wavelength conversion material using a screen printing method or the like, and curing them, each of the layers 2001, 2003, and 2005 may be formed. The wavelength converter 2000 according to an exemplary embodiment may be provided by bonding each of the layers 2001, 2003, and 2005 to each other. A black molding member may be formed of a light absorbing material, and may prevent light emitted from adjacent light emitting devices 10a, 10b, and 10c and the wavelength conversion portions 100r, 100g, and 100b from being mixed with each other.

The red wavelength conversion portion 100r in the first layer 2001 may not vertically overlap with the green wavelength conversion portion 100g in the second layer 2003. In addition, the red wavelength conversion portion 100r in the first layer 2001 may not vertically overlap with the blue wavelength conversion portion 100b in the third layer 2005.

The green wavelength conversion portion 100g in the second layer 2003 may not vertically overlap with the blue wavelength conversion portion 100b in the third layer 2005. In particular, the red wavelength conversion portion 100r in the first layer 2001 is laterally spaced apart from the green wavelength conversion portion 100g in the second layer 2003 or from the blue wavelength conversion portion 100b in the third layer 2005 in plan view, or when viewed from the top, as shown in the drawings.

In the illustrated exemplary embodiment, the first through third layers 2001, 2003, and 2005 in the wavelength converter 2000 are stacked in an order of the red wavelength conversion portion 100r, the green wavelength conversion portion 100g, and the blue wavelength conversion portion 100b, but the inventive concepts are not particularly limited thereto, and the stacking order of the first through third layers 2001, 2003, and 2005 may be adjusted as desired. For example, in consideration of a wavelength conversion efficiency of a wavelength conversion portion, it is possible to compensate for an insufficient wavelength conversion efficiency by arranging a layer including a wavelength conversion portion having the lowest wavelength conversion efficiency on an uppermost side.

The wavelength conversion portions 100r, 100g, and 100b may be formed using phosphors or quantum dots, and the quantum dots may further improve a clarity of the display. The wavelength conversion portions 100r, 100g, and 100b may have structures, in which the phosphors or quantum dots are dispersed in a carrier, such as silicone or epoxy.

Examples of the phosphors may have the following compositional formula and colors.

Aluminum oxide based: yellow and green $Y_3Al_5O_{12}$:Ce, $Tb_3Al_5O_{12}$:Ce, $Lu_3Al_5O_{12}$:Ce.

Silicate based: yellow and green $(Ba,Sr)_2SiO_4$:Eu, yellow and orange $(Ba,Sr)_3SiO_5$:Ce.

Nitride based: green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})xSi_{12-y}N_{18-x-y}$ $(0.5 \leq x \leq 3, 0 < z < 0.3, 0 < y \leq 4)$ (wherein, Ln may be at least one element selected from a group consisting of group IIIa elements and rare earth elements, and M may be at least one element selected from a group consisting of Ca, Ba, Sr, and Mg.)

Fluoride based: red $K_2SiF_6$:Mn$^{4+}$, $K_2TiF_6$:Mn$^{4+}$, NaYF$_4$: Mn$^{4+}$, $NaGdF_4$:Mn$^{4+}$, $K_3SiF_7$:Mn$^{4+}$.

Compositions of the phosphors should basically conform to stoichiometry, and each of the elements may be substituted with another element in each group on the periodic table. For example, Sr can be substituted with Ba, Ca, Mg, or the like of alkaline earth (II) group, and Y can be substituted with lanthanum-based Tb, Lu, Sc, Gd, or the like. In addition, Eu or the like as an activator can be substituted with Ce, Tb, Pr, Er, Yb, or the like according to a desired energy level, and the activator may be used alone or a sub-activator may be additionally applied so as to modify characteristics.

In particular, a fluoride-based red phosphor may be coated with a fluoride without containing Mn so as to improve reliability at high temperature/high humidity, or may further include an organic coating on a surface of the phosphor or a surface of the fluoride coating without containing Mn. In a case of the fluoride-based red phosphor as described above, unlike other phosphors, a narrow full width at half maximum (FWHM) of 40 nm or less may be implemented, and thus, it may be used for high-resolution TVs, such as UHD TVs.

The quantum dot (QD) may have a core-shell structure using a III-V or II-VI compound semiconductor. For example, the quantum dot may have a core such as CdSe, InP, or the like, and a shell such as ZnS, ZnSe, or the like. In addition, the quantum dot may include a ligand for stabilizing the core and the shell. For example, a diameter of the core may be about 1 nm to about 30 nm, further to about 3 nm to about 10 nm. A thickness of the shell may be about 0.1 nm to about 20 nm, further to about 0.5 nm to about 2 nm.

The quantum dot may implement various colors depending on its size, and in particular, may be used as a substitute for a blue, red, or green phosphor. When using the quantum dot, a narrow FWHM (e.g., about 35 nm) may be implemented.

According to the illustrated exemplary embodiment, by using the wavelength converter 2000, in which the first through third layers 2001, 2003, and 2005 for wavelength conversion into light of different colors are stacked, it is possible to provide a light emitting module by using the light emitting devices 10a, 10b, and 10c emitting light of the same type and the same color, and a display apparatus may be implemented by using the light emitting module. Accordingly, it is possible to simplify a transferring process of the light emitting devices 10a, 10b, and 10c, and it is possible to secure a process margin of the wavelength conversion portions 100r, 100g, and 100b.

Figure 3A:
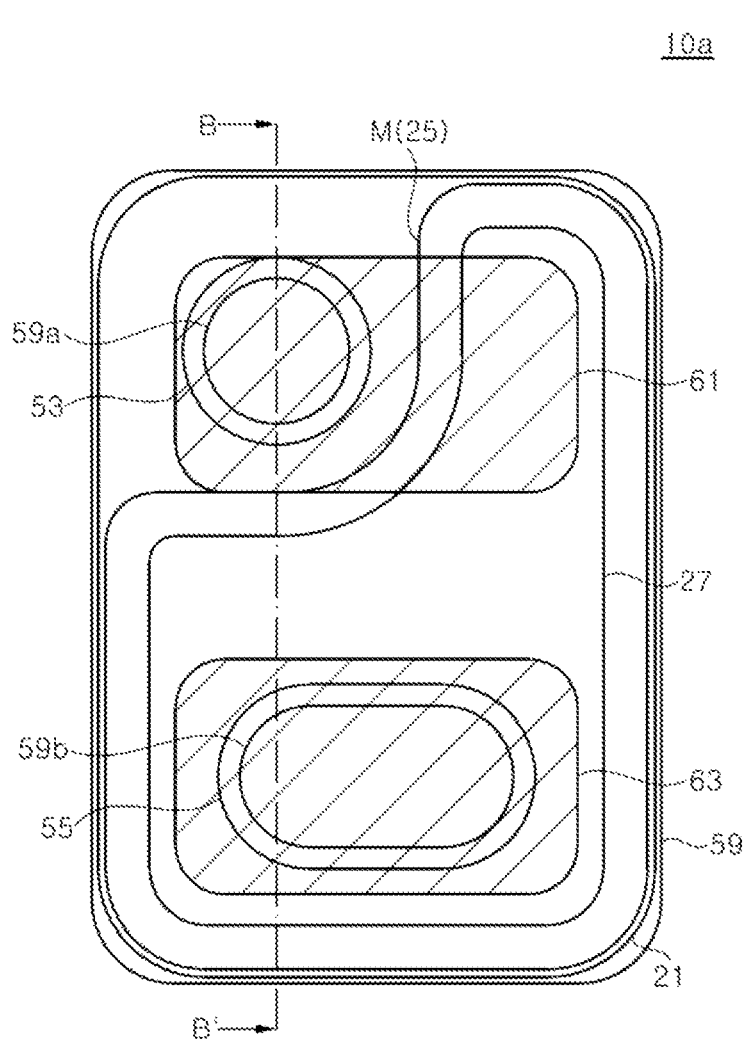
FIG. 3A is a schematic plan view illustrating a light emitting device according to an exemplary embodiment.
Figure 3B:
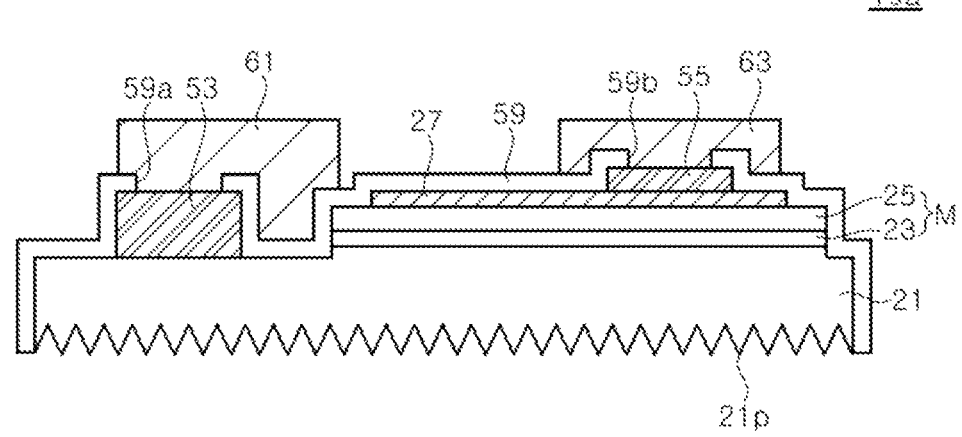
FIG. 3B is a schematic cross-sectional view taken along line B-B' of its corresponding plan view shown in FIG. 3A.

FIG. 3A is a schematic plan view illustrating the light emitting device 10a according to an exemplary embodiment, and FIG. 3B is a schematic cross-sectional view taken along line B-B' of FIG. 3A.

Referring to FIG. 3A and FIG. 3B, the light emitting device 10a may include a light emitting structure including a first conductivity type semiconductor layer 21, an active layer 23, and a second conductivity type semiconductor layer 25, an ohmic contact layer 27, a first contact pad 53, a second contact pad 55, an insulation layer 59, a first electrode pad 61, and a second electrode pad 63.

The light emitting structure, that is, the first conductivity type semiconductor layer 21, the active layer 23, and the second conductivity type semiconductor layer 25, may be grown on a substrate. The substrate may be one of various substrates on which semiconductors may be grown, such as a gallium nitride substrate, a GaAs substrate, a Si substrate, a sapphire substrate, especially a patterned sapphire substrate. The growth substrate may be separated from the semiconductor layers using a process, such as a mechanical grinding, a laser lift off, a chemical lift off process, or the like. However, the inventive concepts are not limited thereto, and, in some exemplary embodiments, a portion of the substrate may be retained in the first conductivity type semiconductor layer 21.

In an exemplary embodiment, in a case of the light emitting devices 10a, 10b, and 10c emitting blue light (440 nm to 460 nm), near ultraviolet (390 nm to 440 nm), or ultraviolet (320 nm to 390 nm), the semiconductor layer may include gallium nitride (GaN), indium gallium nitride (InGaN), or zinc selenide (ZnSe).

The first conductivity type and the second conductivity type of semiconductor layers 21 and 25 have opposite polarities. For example, when the first conductivity type is an n-type, the second conductivity type is formed as a p-type, and, when the first conductivity type is a p-type, the second conductivity type is formed as an n-type.

The first conductivity type semiconductor layer 21, the active layer 23, and the second conductivity type semiconductor layer 25 may be grown on the substrate in a chamber using a process well known in the art, such as metal organic chemical vapor deposition (MOCVD) process. In addition, the first conductivity type semiconductor layer 21 includes n-type impurities (e.g., Si, Ge, and Sn), and the second conductivity type semiconductor layer 25 includes p-type impurities (e.g., Mg, Sr, and Ba). In an exemplary embodiment, the first conductivity type semiconductor layer 21 may include GaN or AlGaN containing Si as a dopant, and the second conductivity type semiconductor layer 25 may include GaN or AlGaN containing Mg as a dopant.

Although the first conductivity type semiconductor layer 21 and the second conductivity type semiconductor layer 25 are illustrated as single layers in the drawings, these layers may be multiple layers, and may also include a superlattice layer. The active layer 23 may include a single quantum well structure or a multiple quantum well structure, and a composition ratio of a nitride-based semiconductor may be adjusted to emit light in a desired wavelength. For example, the active layer 23 may emit blue light or ultraviolet light.

The second conductivity type semiconductor layer 25 and the active layer 23 may have a mesa M structure, and may be disposed on the first conductivity type semiconductor layer 21. The mesa M may include the second conductivity type semiconductor layer 25 and the active layer 23, and may include a portion of the first conductivity type semiconductor layer 21 as shown in FIG. 3B. The mesa M is disposed on a partial region of the first conductivity type semiconductor layer 21, and an upper surface of the first conductivity type semiconductor layer 21 may be exposed around the mesa M.

In the illustrated exemplary embodiment, the mesa M exposes an upper surface of the first conductivity type semiconductor layer 21 therearound. In another exemplary embodiment, a through hole may be formed through the mesa M to expose the first conductivity type semiconductor layer 21.

The first conductivity type semiconductor layer 21 may have a concave-convex pattern 21p by surface texturing. The concave-convex pattern 21p may be formed on a light exiting surface of the first conductivity type semiconductor layer 21. Surface texturing may be carried out by patterning, for example, using a dry or wet etching process.

In an exemplary embodiment, cone-shaped protrusions may be formed, a height of the cone may be about 2 µm to about 3 µm, a distance between the cones may be about 1.5 µm to about 2 µm, and a diameter of a bottom of the cone may be about 3 µm to about 5 µm. The cone may also be truncated, in which an upper diameter of the cone may be about 2 µm to about 3 µm.

In another exemplary embodiment, the concave-convex pattern 21p may include a first concave-convex pattern and a second concave-convex pattern additionally formed on the first concave-convex pattern. The second concave-convex pattern may be formed to have a smaller size than that of the first concave-convex pattern.

By forming the concave-convex pattern 21p on the surface of the first conductivity type semiconductor layer 21, total internal reflection may be reduced, thereby increasing light extraction efficiency. Surface texturing may be carried out on the first conductivity type semiconductor layers of all of the first, second, and third light emitting devices 10a, 10b, and 10c, and thus, viewing angles of light emitted from the first, second, and third light emitting devices 10a, 10b, and 10c may become uniform. However, the inventive concepts are not limited thereto, and portions of the light emitting devices may have flat surfaces without including the concave-convex pattern 21p.

The ohmic contact layer 27 is disposed on the second conductivity type semiconductor layer 25 to be in ohmic contact with the second conductivity type semiconductor layer 25. The ohmic contact layer 27 may be formed of a single layer or multiple layers, and may be formed of a transparent conductive oxide film or a metal film. For example, the transparent conductive oxide film may include ITO, ZnO, or the like, and the metal film may include metal such as Al, Ti, Cr, Ni, Au, or the like, and an alloy thereof.

The first contact pad 53 is disposed on the exposed first conductivity type semiconductor layer 21. The first contact pad 53 may be in ohmic contact with the first conductivity type semiconductor layer 21. For example, the first contact pad 53 may be formed of an ohmic metal layer in ohmic contact with the first conductivity type semiconductor layer 21. The material for the ohmic metal layer of the first contact pad 53 may be chosen depending on a semiconductor material of the first conductivity type semiconductor layer 21. In some exemplary embodiments, the first contact pad 53 may be omitted.

The second contact pad 55 may be disposed on the ohmic contact layer 27. The second contact pad 55 is electrically connected to the ohmic contact layer 27. In some exemplary embodiments, the second contact pad 55 may be omitted.

The insulation layer 59 covers the mesa M, the ohmic contact layer 27, the first contact pad 53, and the second contact pad 55. The insulation layer 59 has openings 59a and 59b exposing the first contact pad 53 and the second contact pad 55. The insulation layer 59 may be formed as a single layer or multiple layers. Further, the insulation layer 59 may include a distributed Bragg reflector, in which insulation layers having different refractive indices are stacked. For example, the distributed Bragg reflector may include at least two insulation layers selected from SiO$_2$, Si$_3$N$_4$, SiON, TiO$_2$, Ta$_2$O$_5$, and Nb2O$_5$.

The distributed Bragg reflector reflects light emitted from the active layer 23. The distributed Bragg reflector may exhibit high reflectance over a relatively wide wavelength range including a peak wavelength of light emitted from the active layer 23, and may be designed in consideration of an incident angle of light. In an exemplary embodiment, the distributed Bragg reflector may have a higher reflectance for light incident at an incident angle of 0 degrees than that for light incident at a different incident angle. In another exemplary embodiment, the distributed Bragg reflector may have a higher reflectance for light incident at a particular incident angle than that for light incident at the incident angle of 0 degrees. For example, the distributed Bragg reflector may have a higher reflectance for light incident at an incident angle of 10 degrees than that for light incident at the incident angle of 0 degrees.

In an exemplary embodiment, the distributed Bragg reflectors applied to the light emitting devices 10a, 10b, and 10c may have substantially similar thicknesses. For example, a difference in thicknesses between the distributed Bragg reflectors applied to the light emitting devices 10a, 10b, and 10c may be within 10% or less of a thickness of the thickest distributed Bragg reflector. By reducing the thickness difference between the distributed Bragg reflectors, process conditions applied to the light emitting devices 10a, 10b, and 10c, for example, a process of patterning the insulation layer 59, may be similarly set and facilitate the unit pixel manufacturing process. Moreover, the number of stacked layers forming the distributed Bragg reflectors applied to the light emitting devices 10a, 10b, and 10c may have substantially similar to each other, without being limited thereto.

The first electrode pad 61 and the second electrode pad 63 are disposed on the insulation layer 59. The first electrode pad 61 may extend from an upper region of the first contact pad 53 to an upper region of the mesa M, and the second electrode pad 63 may be disposed in the upper region of the mesa M. The first electrode pad 61 may be connected to the first contact pad 53 through the opening 59a, and the second electrode pad 63 may be electrically connected to the second contact pad 55. In some exemplary embodiments, the first electrode pad 61 may be in direct ohmic contact with the first conductivity type semiconductor layer 21, and in this case, the first contact pad 53 may be omitted. In addition, when the second contact pad 55 is omitted, the second electrode pad 63 may be directly connected to the ohmic contact layer 27.

The first and/or second electrode pads 61 and 63 may be formed of a single layer or a multilayer metal. As a material of the first and/or second electrode pads 61 and 63, metals such as Al, Ti, Cr, Ni, Au, or the like, or an alloy thereof may be used.

Although the light emitting device 10a according to an exemplary embodiment has been briefly described with reference to the drawings, the light emitting device 10a may further include a layer having additional functions in addition to the above-described layers. For example, various layers, such as a reflection layer for reflecting light, an additional insulation layer for insulating a specific element, and a solder preventing layer for preventing diffusion of solder may be further included.

In addition, when a flip chip type light emitting device is formed, the mesa may be formed to have various shapes, and locations and shapes of the first and second electrode pads 61 and 63 may also be variously modified. Further, in some exemplary embodiments, the ohmic contact layer 27 may be omitted, and the second contact pad 55 or the second electrode pad 63 may directly contact the second conductivity type semiconductor layer 25.

Figure 4:
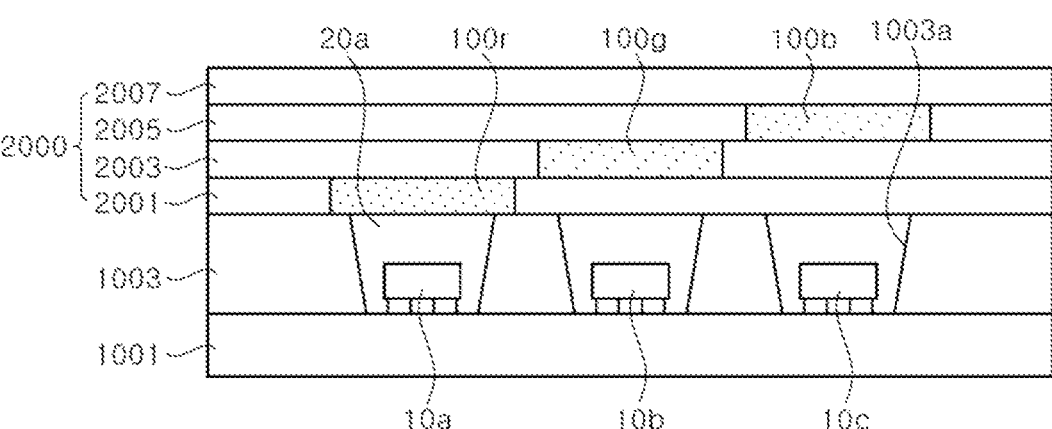
FIG. 4 is a schematic cross-sectional view illustrating a light emitting module according to an exemplary embodiment.

FIG. 4 is a schematic cross-sectional view illustrating a light emitting module according to an exemplary embodiment.

Referring to FIG. 4, the light emitting module according to the illustrated exemplary embodiment is substantially similar to the light emitting module 1000 described with reference to FIG. 2A and FIG. 2B, except that the wavelength converter 2000 further includes an upper molding layer 2007 formed of a light absorbing material, such as a black matrix. The molding layer 2007 may be formed by applying a molding layer including the light absorbing material on the third layer 2005. The molding layer 2007 may be disposed on an uppermost surface of the wavelength converter 2000. The molding layer 2007 may include a material that blocks light of a specific wavelength. In particular, the molding layer 2007 may include a material that blocks light that is not wavelength-converted after being emitted from the light emitting devices 10a, 10b, and 10c. In this manner, 90% or more of light finally emitted from the light emitting module may be light that is wavelength-converted through the wavelength converter 2000.

According to the illustrated exemplary embodiment, when a display is turned off, a display apparatus with the uppermost layer formed of a black material may make a luxurious impression. The light absorbing material distributed in the molding layer 2007 may be uniform as a whole, but may be non-uniform in a thickness direction. For example, more light absorbing materials may be distributed as they are disposed closer to the surface of the molding layer 2007.

Figure 5:
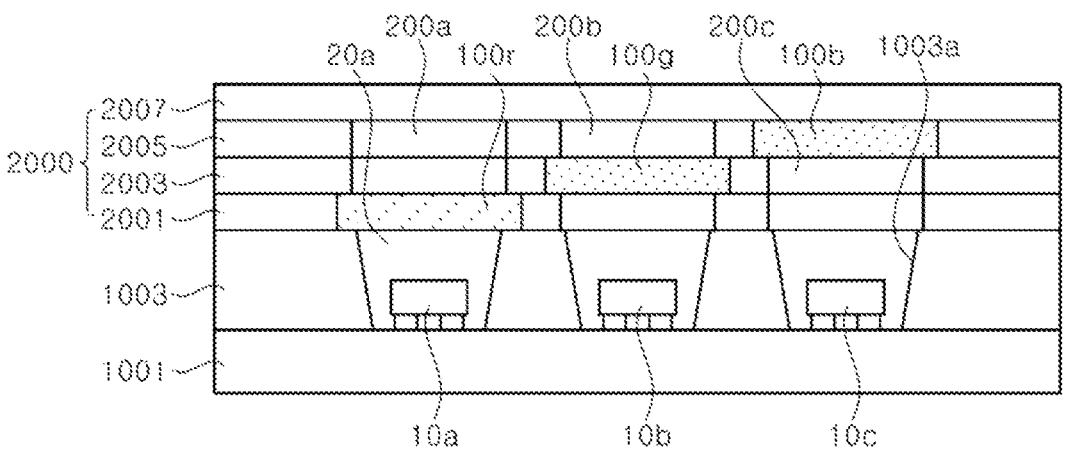
FIG. 5 is a schematic cross-sectional view illustrating a light emitting module according to an exemplary embodiment.

FIG. 5 is a schematic cross-sectional view illustrating a light emitting module according to an exemplary embodiment.

Referring to FIG. 5, the light emitting module according to the illustrated exemplary embodiment is substantially similar to the light emitting module described with reference to FIG. 4, except that the layers 2001, 2003, and 2005 of the wavelength converter 2000 include transparent molding portions 200a, 200b, and 200c, respectively.

The first layer 2001, the second layer 2003, and the third layer 2005 of the wavelength converter 2000 according to the illustrated exemplary embodiment have transparent molding portions 200a, 200b, and 200c at locations corresponding to the light emitting devices 10a, 10b, and 10c, in addition to regions where the wavelength conversion portions 100r, 100g, 100b are formed, respectively. For example, the first layer 2001 includes transparent molding portions 200b and 200c corresponding to the light emitting devices 10b and 10c in conjunction with the wavelength conversion portion 100r corresponding to the light emitting device 10a. In addition, the second layer 2003 includes transparent molding portions 200a and 200c corresponding to the light emitting devices 10a and 10c in conjunction with the wavelength conversion portion 100g corresponding to the light emitting device 10b, and the third layer 2005 includes the transparent molding portions 200a and 200b corresponding to the light emitting devices 10a and 10b in conjunction with the wavelength conversion portion 100b corresponding to the light emitting device 10c.

The transparent molding portions 200a formed on the second layer 2003 and the third layer 2005 may be disposed to correspond to the wavelength conversion portion 100r, the transparent molding portions 200b formed on the first layer 2001 and the third layer 2005 may be disposed to correspond to the wavelength conversion portion 100g, and the transparent molding portions 200c formed on the first layer 2001 and the second layer 2003 may be disposed to correspond to the wavelength conversion portion 100b. The transparent molding portions 200a may be disposed on the wavelength conversion portion 100r, the transparent molding portions 200b may be disposed above and below the wavelength conversion portion 100g, and the transparent molding portions 200c may be disposed below the wavelength conversion portion 100b.

Areas of the transparent molding portions 200a, 200b, and 200c may be smaller than those of the corresponding wavelength conversion portions 100r, 100g, and 100b. Also, the areas of the transparent molding portions 200a, 200b, and 200c may be similar to that of an inlet of a groove formed by the partition structure 1003. By forming the transparent molding portions 200a, 200b, and 200c to be smaller than the areas of the wavelength conversion portions 100r, 100g, and 100b, the wavelength conversion portions 100r, 100g, and 100b and the transparent molding portions 200a, 200b, and 200c may be easily disposed in same layers 2001, 2003, and 2005, respectively.

The transparent molding portions 200a, 200b, and 200c may be formed of transparent resins, but may also include diffusers, such as $TiO_2$. Although the transparent molding portions 200a, 200b, and 200c are disposed in the light emitting module according to the illustrated exemplary embodiment, in some exemplary embodiments, empty spaces may be formed without forming the molding portions in regions corresponding to the transparent molding portions 200a, 200b, and 200c.

By disposing the transparent molding portions 200a, 200b, and 200c or empty spaces in regions of different layers corresponding to each of the wavelength conversion portions 100r, 100g, and 100b, luminance of the wavelength-converted light may be improved.

FIG. 6 is a schematic cross-sectional view illustrating a light emitting module according to an exemplary embodiment.

Referring to FIG. 6, the light emitting module according to the illustrated exemplary embodiment is substantially similar to the light emitting module 1000 described with reference to FIG. 2A and FIG. 2B, except the shape of the partition disposed between the light emitting devices 10a, 10b, and 10c. As described above, the partition structure 1003 forms the empty space in the region where the light emitting devices 10a, 10b, and 10c are disposed. In the light emitting module shown in FIGS. 2A and 2B, the sidewall formed around the light emitting devices 10a, 10b, and 10c has an inclined shape, but in the illustrated exemplary embodiment, the sidewall has a shape perpendicular to an upper surface of the circuit board 1001.

Figure 7:
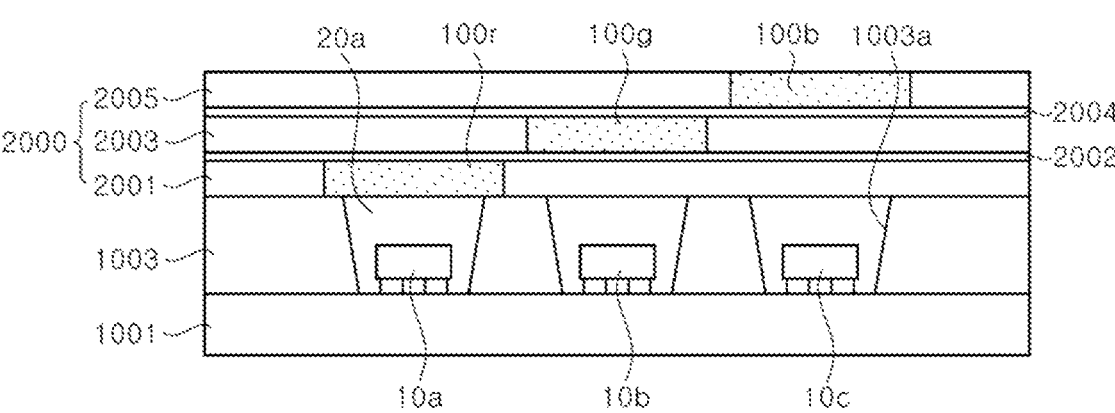
FIG. 7 is a schematic cross-sectional view illustrating a light emitting module according to an exemplary embodiment.

FIG. 7 is a schematic cross-sectional view illustrating a light emitting module according to an exemplary embodiment.

Referring to FIG. 7, the light emitting module according to the illustrated exemplary embodiment is substantially similar to the light emitting module 1000 described with reference to FIG. 2A and FIG. 2B, except that the wavelength converter 2000 includes adhesives 2002 and 2004.

The adhesive 2002 may be disposed between the first layer 2001 and the second layer 2003 to adhere them, and the adhesive 2004 may be disposed between the second layer 2003 and the third layer 2005 to adhere them. The adhesives 2002 and 2004 may be formed of transparent adhesives.

Figure 8:
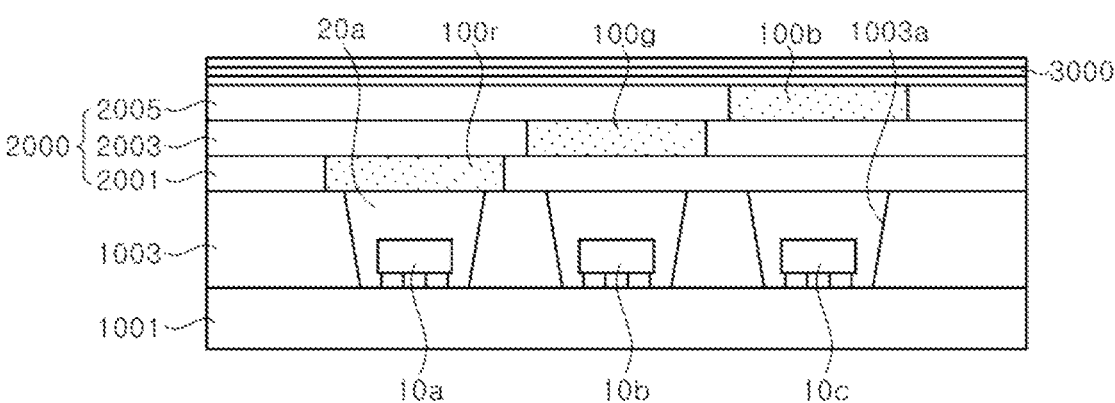
FIG. 8 is a schematic cross-sectional view illustrating a light emitting module according to an exemplary embodiment.

FIG. 8 is a schematic cross-sectional view illustrating a light emitting module according to an exemplary embodiment.

Referring to FIG. 8, the light emitting module according to the illustrated exemplary embodiment is substantially similar to the light emitting module 1000 described with reference to FIGS. 2A and 2B, except that it further includes an ultraviolet filter 3000.

The ultraviolet filter 3000 may be an ultraviolet absorption film including an ultraviolet absorber or an interference filter formed by alternately coating layers having different refractive indices.

Figure 9:
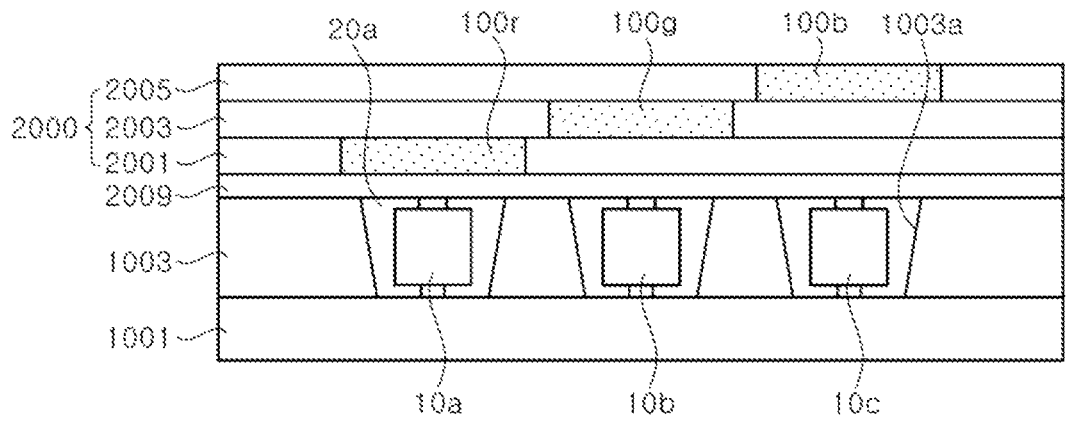
FIG. 9 is a schematic cross-sectional view illustrating a light emitting module according to an exemplary embodiment.

FIG. 9 is a schematic cross-sectional view illustrating a light emitting module according to an exemplary embodiment.

Referring to FIG. 9, the light emitting module according to the illustrated exemplary embodiment is substantially similar to the light emitting module 1000 described with reference to FIGS. 2A and 2B, except that it includes vertical light emitting devices 10a, 10b, and 10c, and further includes a transparent electrode 2009.

The light emitting devices 10a, 10b, and 10c may include upper and lower electrodes on upper and lower surfaces, respectively, and the upper and lower electrodes may be electrically connected to the circuit board 1001 and the transparent electrode 2009. For example, the light emitting devices 10a, 10b, and 10c may be individually electrically connected to the circuit board 1001 through the lower electrodes, and may be commonly electrically connected to the transparent electrode 2009 through the upper electrodes.

The transparent electrode 2009 may be disposed on the partition structure 1003, and the wavelength converter 2000 may be disposed on the transparent electrode 2009.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting module, comprising:
a substrate:
a plurality of light emitters disposed on the substrate and configured to emit light of a first wavelength;
a plurality of partitions disposed on the substrate, wherein each of the plurality of partitions includes a groove corresponding to each of the plurality of light emitters, the groove including an inclined side surface, and
a plurality of wavelength converters configured to convert light of the first wavelength emitted from one of the plurality of light emitters into light of a wavelength different from the first wavelength, the plurality of the wavelength converters comprising a first layer including a light absorption material and a first wavelength conversion material, a second layer arranged on the first layer including the light absorption material and a second wavelength conversion material and a third layer arranged on the second layer including the light absorption material and a third wavelength conversion material,
wherein the first wavelength conversion material in the first layer, the second wavelength conversion material in the second layer and the third wavelength conversion material in the third layer are laterally spaced apart from each other in a plan view, and
wherein each of the plurality of light emitters includes a light exiting surface and the light exiting surface includes a first textured region and a second textured region on the first textured region and smaller in size than the first textured region.

2. The light emitting module of claim 1, wherein the first wavelength conversion material and the second wavelength conversion material include a phosphor or a quantum dot.

3. The light emitting module of claim 2, wherein the first wavelength conversion material is different from the second wavelength conversion material.

4. The light emitting module of claim 3, wherein the first wavelength conversion material is a red wavelength conversion material and the second wavelength conversion material is a green wavelength conversion material.

5. The light emitting module of claim 3, wherein each of the partitions includes a reflective material and is configured to prevent light interference between light emitted from the plurality of wavelength converters.

6. A display device, comprising:
a panel substrate; and
a light module disposed on the panel substrate, wherein the light module comprises
a substrate including a circuit:
a plurality of light emitters disposed on the substrate and configured to emit a first wavelength:
a plurality of partitions disposed on the substrate, wherein each of the plurality of partitions includes a groove corresponding to each of the plurality of light emitters, the groove including an inclined side surface; and
a plurality of wavelength converters configured to convert light of the first wavelength emitted from one of the plurality of light emitters into light of a wavelength different from the first wavelength, wherein each of the plurality of wavelength converters is disposed on the groove corresponding to each of the plurality of light emitters, the plurality of wavelength converters comprising a first layer including a light absorption material and a first wavelength conversion material, a second layer arranged on the first layer including the light absorption material and a second wavelength conversion material and a third layer arranged on the second layer including the light absorption material and a third wavelength conversion material, wherein the first wavelength conversion material in the first layer, the second wavelength conversion material in the second layer and the third wavelength conversion material in the third layer are laterally spaced apart from each other in a plan view, and wherein each of the plurality of light emitters includes a light exiting surface and the light exiting surface includes a first textured region and a second textured region on the first textured region and smaller in size than the first textured region.

7. The display device of claim 6, wherein the first wavelength conversion material and the second wavelength conversion material include a phosphor or a quantum dot.

8. The display device of claim 7, wherein the first conversion material is different from the second wavelength conversion material.

9. The display device of claim 8, wherein the first wavelength conversion material is a red wavelength conversion material and the second wavelength conversion material is a green wavelength conversion material.

10. A display device, comprising:
a panel substrate; and
a light source disposed on the panel substrate, wherein the light source comprises
a substrate including a circuit:
light emitters disposed on the substrate and configured to emit a first wavelength:

partitions disposed on the substrate, wherein each of the partitions includes a groove corresponding to each of light emitters, the groove including an inclined side surface; and wavelength converters disposed on the substrate, each of the wavelength converters being disposed on the groove corresponding to each of the light emitters, the wavelength converters comprising a first layer including a light absorption material and a first wavelength conversion material, a second layer arranged on the first layer including the light absorption material and a second wavelength conversion material and a third layer arranged on the second layer including the light absorption material and a third wavelength conversion material, wherein the first wavelength conversion material in the first layer, the second wavelength conversion material in the second layer and the third wavelength conversion material in the third layer are laterally spaced apart from each other in a plan view, and wherein at least one of the light emitters includes a light exiting surface and the light exiting surface includes a first textured region and a second textured region on the first textured region and smaller in size than the first textured region.

11. The display device of claim 10, wherein at least one of the wavelength converters has a larger area than the corresponding light emitter.

12. The display device of claim 11, wherein the light absorption material includes a material that blocks light of a specific wavelength.

13. The display device of claim 10, wherein the first wavelength conversion material is different from the second wavelength conversion material.

14. The display device of claim 13, wherein the first wavelength conversion material is a red wavelength conversion material, the second wavelength conversion material is a green wavelength conversion material.

* * * * *